United States Patent
Tanabe et al.

(10) Patent No.: US 10,128,143 B2
(45) Date of Patent: Nov. 13, 2018

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Masahito Tanabe, Annaka (JP); Michihiro Sugo, Takasaki (JP); Hiroyuki Yasuda, Tomioka (JP); Shohei Tagami, Annaka (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 329 days.

(21) Appl. No.: 14/955,938

(22) Filed: Dec. 1, 2015

(65) Prior Publication Data
US 2016/0189996 A1    Jun. 30, 2016

(30) Foreign Application Priority Data
Dec. 25, 2014 (JP) ................ 2014-262026

(51) Int. Cl.
*H01L 21/683* (2006.01)
*C09J 183/04* (2006.01)
(Continued)

(52) U.S. Cl.
CPC ............ *H01L 21/6836* (2013.01); *B32B 7/12* (2013.01); *C08K 5/56* (2013.01); *C08L 83/00* (2013.01);
(Continued)

(58) Field of Classification Search
CPC ............ H01L 21/6836; H01L 21/30625; H01L 21/304; C09J 183/04; C09J 2483/00
See application file for complete search history.

(56) References Cited

U.S. PATENT DOCUMENTS 7,541,264 B2   6/2009   Gardner et al.
2005/0233547 A1   10/2005   Noda et al.
(Continued)

FOREIGN PATENT DOCUMENTS

JP   2004-064040 A   2/2004
JP   2006-328104 A   12/2006

OTHER PUBLICATIONS

Mar. 23, 2016 Extended Search Report issued in European Patent Application No. 15003493.2.

*Primary Examiner* — Scott R. Walshon
(74) *Attorney, Agent, or Firm* — Oliff PLC

(57) ABSTRACT

Temporary adhesive material for wafer processing, the temporary adhesive material being used for temporarily bonding support to wafer having circuit-forming front surface and back surface to be processed, including complex temporary adhesive material layer that has first temporary adhesive layer composed of thermosetting siloxane polymer layer (A), second temporary adhesive layer composed of thermosetting polymer layer (B), and third temporary adhesive layer composed of thermoplastic resin layer (C), wherein the polymer layer (A) is cured layer of composition containing (A-1) an organopolysiloxane having alkenyl group within its molecule, (A-2) an organopolysiloxane having $R^{10}{}_3SiO_{0.5}$ unit and $SiO_2$ unit, (A-3) organohydrogenpolysiloxane having two or more Si—H groups per molecule, and (A-4) platinum-based catalyst. There can be provided a wafer processing laminate, temporary adhesive material for wafer processing, and method for manufacturing thin wafer using the same which facilitate temporary adhesion and delamination, has excellent CVD resistance, and increasing productivity of thin wafers.

15 Claims, 1 Drawing Sheet

(51) Int. Cl.
*B32B 7/12* (2006.01)
*H01L 21/304* (2006.01)
*H01L 21/306* (2006.01)
*C08K 5/56* (2006.01)
*C08L 83/00* (2006.01)
*C08G 77/52* (2006.01)
*C08G 77/12* (2006.01)
*C08G 77/20* (2006.01)

(52) U.S. Cl.
CPC .......... *C09J 183/04* (2013.01); *H01L 21/304* (2013.01); *H01L 21/30625* (2013.01); *H01L 21/6835* (2013.01); *B32B 2250/02* (2013.01); *B32B 2255/26* (2013.01); *B32B 2457/14* (2013.01); *C08G 77/12* (2013.01); *C08G 77/20* (2013.01); *C08G 77/52* (2013.01); *H01L 2221/6834* (2013.01); *H01L 2221/68327* (2013.01); *H01L 2221/68381* (2013.01)

(56) References Cited

U.S. PATENT DOCUMENTS

| | | | |
|---|---|---|---|
| 2007/0120271 A1 | 5/2007 | Kozakai et al. | |
| 2011/0136321 A1* | 6/2011 | Kuroda | H01L 21/6835 438/459 |
| 2013/0220687 A1* | 8/2013 | Tagami | C09J 7/00 174/259 |
| 2014/0154868 A1 | 6/2014 | Sugo et al. | |

* cited by examiner

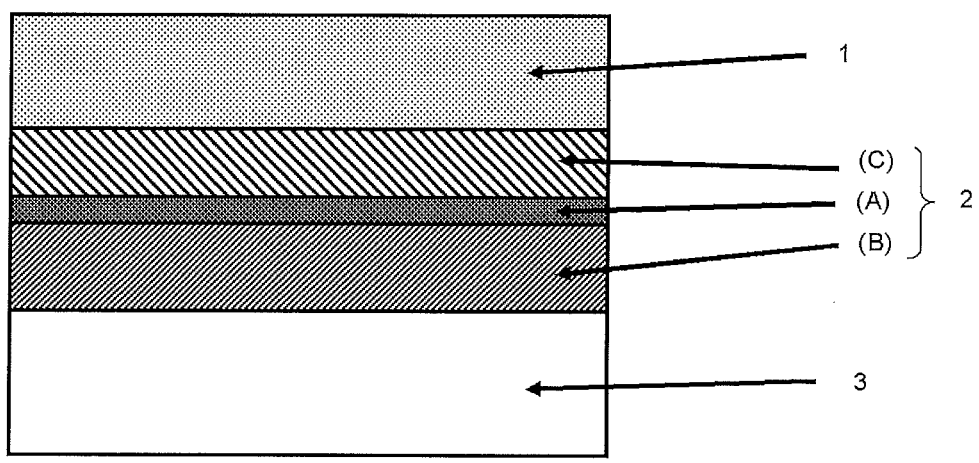

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to a wafer processing laminate, a temporary adhesive material for a wafer processing, and a method for manufacturing a thin wafer which can realize to obtain a thin wafer effectively.

BACKGROUND ART

Three-dimensional semiconductor mounting has become essential for higher density and larger capacity. A three-dimensional mounting technique is a semiconductor production technique for thinning a semiconductor chip, and connecting the chip to another chip using a through silicon via (TSV) to form a multilayer. In order to realize this technique, steps of grinding a non-circuit-forming surface (also referred to as "back surface") of a substrate on which a semiconductor circuit has been formed to thin the substrate, and then forming an electrode including a TSV on the back surface, are required. Conventionally, in the step of grinding the back surface of a silicon substrate, a protective tape for the back surface is attached to a surface opposite to a surface to be ground for preventing breakage of the wafer during grinding. However, this tape uses an organic resin film as the support base, which has flexibility, but inadequate strength and heat resistance. Therefore, this tape is not suited to the steps of forming a TSV and forming a wiring layer on the back surface.

For this reason, a system has been proposed in which a semiconductor substrate is bonded to a support made of silicon, glass, or the like, through an adhesive layer to sufficiently withstand the steps of grinding a back surface and forming a TSV and an electrode on the back surface. In this system, the adhesive layer used for bonding the substrate to the support is important. The adhesive layer requires sufficient durability to bond the substrate to the support without gaps and to withstand subsequent steps. Further, it is necessary that a thin wafer can be easily delaminated from the support finally. Hence, the adhesive layer is finally delaminated, it is referred herein to as "temporary adhesive layer" (or, temporary adhesive material layer).

As to the conventionally known temporary adhesive layers and a method for delaminating the same, there have been proposed a technique in which high intensity light is irradiated to an adhesive material containing a light-absorbing substance to decompose the adhesive material layer whereby the adhesive material layer is delaminated from the support (Patent Literature 1), and a technique in which a heat fusible hydrocarbon compound is used for an adhesive material, and bonding and delamination are carried out in a heat-molten state (Patent Literature 2). The former technique has the problems that it requires an expensive tool such as laser, and a treatment time per one substrate is longer. The latter technique is simple because of control only by heat, but the applicable range is limited since thermal stability at high temperatures exceeding 200° C. is insufficient. Further, these temporary adhesive layers are not adequate to form a film with uniform thickness on a heavily stepped substrate and to provide a complete adhesion to the support.

Besides, it has been proposed to use a silicone adhesive agent for the temporary adhesive material layer (Patent Literature 3). This is to bond a substrate to a support by using an addition curable type silicone adhesive agent, and on delamination, the assembly is immersed in a chemical solution capable of dissolving or decomposing the silicone resin, whereby the substrate is separated from the support. Thus, this method takes a very long time for delamination and is difficulty applicable to the actual manufacturing process.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264

SUMMARY OF THE INVENTION

Technical Problem

The present invention was accomplished in view of the above-described problems, and has an object to provide a wafer processing laminate, a temporary adhesive material for a wafer processing, and a method for manufacturing a thin wafer using the same, which facilitate temporary adhesion, allow to form a layer with uniform film thickness on a heavily stepped substrate, are highly compatible with steps of forming a TSV and forming a wiring on the back surface of the wafer, have excellent resistance to a thermal process for wafer such as CVD (chemical vapor deposition), enable easy delamination, and are capable of increasing productivity of thin wafers.

Solution to Problem

To accomplish the objects, the present invention provides a temporary adhesive material for a wafer processing, the temporary adhesive material being used for temporarily bonding a support to a wafer having a circuit-forming front surface and a back surface to be processed, comprising a complex temporary adhesive material layer that has a first temporary adhesive layer composed of a thermosetting siloxane polymer layer (A), a second temporary adhesive layer composed of a thermosetting polymer layer (B) laminated on one surface of the first temporary adhesive layer, and a third temporary adhesive layer composed of a thermoplastic resin layer (C) laminated on the other surface of the first temporary adhesive layer, wherein the thermosetting siloxane polymer layer (A) is a cured layer of a composition containing:

(A-1) 100 to 50 parts by mass of an organopolysiloxane having an alkenyl group within its molecule;

(A-2) 0 to 50 parts by mass of an organopolysiloxane having $R^{10}{}_3SiO_{0.5}$ unit and $SiO_2$ unit with a molar ratio of $R^{10}{}_3SiO_{0.5}$ unit/$SiO_2$ unit ranging from 0.5 to 1.7, where $R^{10}$ represents a substituted or unsubstituted monovalent hydrocarbon group having 1 to 10 carbon atoms, provided that a total of the components (A-1) and (A-2) is 100 parts by mass and the component (A-2) is contained in amount of more than 0 part by mass;

(A-3) an organohydrogenpolysiloxane having two or more silicon-bonded hydrogen atoms (i.e. Si—H group) per molecule, in such an amount that a molar ratio of the Si—H group in the component (A-3) to the alkenyl group in the component (A-1) ranges from 0.3 to 15; and (A-4) an effective amount of a platinum-based catalyst.

Also, the present invention provides a wafer processing laminate comprising a support, a temporary adhesive material layer formed on the support, and a wafer laminated on the temporary adhesive material layer, the wafer having a circuit-forming front surface and a back surface to be processed, the temporary adhesive material layer including a complex temporary adhesive material layer that has a first temporary adhesive layer composed of a thermosetting siloxane polymer layer (A), a second temporary adhesive layer composed of a thermosetting polymer layer (B) laminated on one surface of the first temporary adhesive layer, and a third temporary adhesive layer composed of a thermoplastic resin layer (C) laminated on the other surface of the first temporary adhesive layer, wherein the thermosetting siloxane polymer layer (A) is a cured layer of a composition containing:

(A-1) 100 to 50 parts by mass of an organopolysiloxane having an alkenyl group in its molecule;

(A-2) 0 to 50 parts by mass of an organopolysiloxane having $R^{10}{}_3SiO_{0.5}$ unit and $SiO_2$ unit with a molar ratio of $R^{10}{}_3SiO_{0.5}$ unit/$SiO_2$ unit ranging from 0.5 to 1.7, where $R^{10}$ represents a substituted or unsubstituted monovalent hydrocarbon group having 1 to 10 carbon atoms, provided that a total of the components (A-1) and (A-2) is 100 parts by mass and the component (A-2) is contained in amount of more than 0 part by mass;

(A-3) an organohydrogenpolysiloxane having two or more silicon-bonded hydrogen atoms (i.e. Si—H group) per molecule, in such an amount that a molar ratio of the Si—H group in the component (A-3) to the alkenyl group in the component (A-1) ranges from 0.3 to 15; and (A-4) an effective amount of a platinum-based catalyst.

Such a wafer processing laminate and a temporary adhesive material for a wafer processing facilitate temporary adhesion between a wafer and a support, enable a film to be formed with uniform thickness on a heavily stepped substrate, are highly compatible with steps of forming a TSV and forming a wiring on the back surface of the wafer, have excellent resistance to a thermal process such as CVD, enable easy delamination, and are capable of increasing productivity of thin wafers.

In these cases, the thermosetting siloxane polymer layer (A) preferably further contains (A-5) a reaction retarder in an amount of 0.1 to 10 parts by mass based on 100 parts by mass of a total of the components (A-1), (A-2), and (A-3).

Such a thermosetting siloxane polymer layer (A) can prevent thickening viscosity and gelation of the solution to be treated (i.e. the composition) before thermal curing.

In addition, it is preferred that after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm.

The thermosetting siloxane polymer layer (A) having such peeling forces is preferred since the product becomes more excellent in resistance to a subsequent processing, CVD and enables easy delamination, and there is no fear of causing slippage of the wafer at the time of grinding the wafer.

In addition, the thermosetting polymer layer (B) is preferably a cured layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

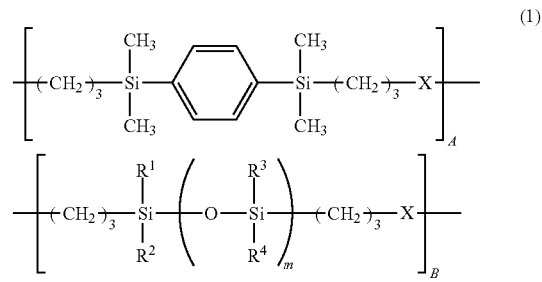

wherein $R^1$ to $R^4$ may be the same or different, and represent a monovalent hydrocarbon group having 1 to 8 carbon atoms; "m" is an integer of 1 to 100; B is a positive number; A is 0 or a positive number; A+B=1; and X is a divalent organic group represented by the following general formula (2),

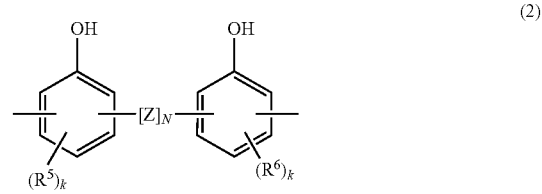

wherein Z represents a divalent organic group selected from any of

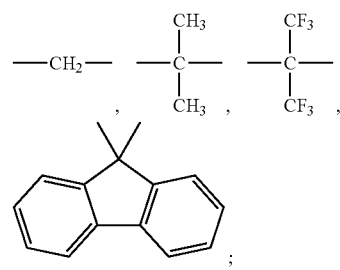

N represents 0 or 1; $R^5$ and $R^6$ each represent an alkyl or alkoxy group having 1 to 4 carbon atoms, and may be the same or different from each other; and "k" represents any of 0, 1, and 2.

Such a thermosetting polymer layer (B) is preferred since the product becomes further excellent in heat resistance.

In addition, the thermosetting polymer layer (B) is preferably a cured layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

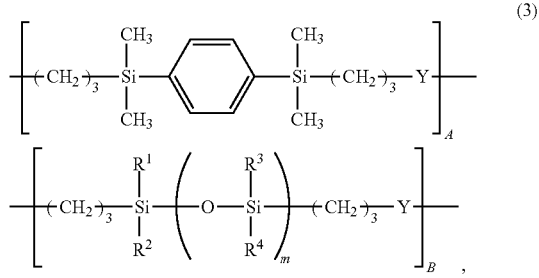

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number; A+B=1; and Y is a divalent organic group represented by the following general formula (4),

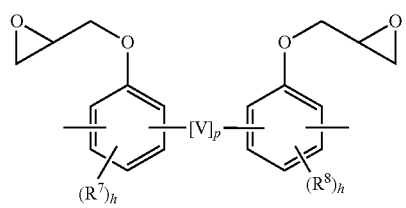

(4)

wherein V represents a divalent organic group selected from any of

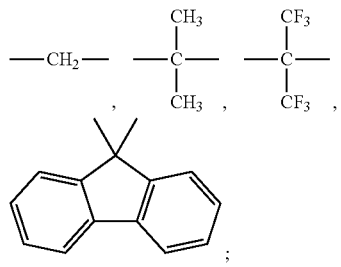

"p" represents 0 or 1; $R^7$ and $R^8$ each represent an alkyl or alkoxy group having 1 to 4 carbon atoms, and may be the same or different from each other; and "h" represents any of 0, 1, and 2.

Such a thermosetting polymer layer (B) is preferred since the product becomes further excellent in heat resistance.

Further, the present invention also provides a method for manufacturing a thin wafer, comprising the steps of:

(a) bonding a support to a circuit-forming front surface of a wafer that has the circuit-forming front surface and a non-circuit-forming back surface through the temporary adhesive material for a wafer processing of the present invention;

(b) thermally curing the polymer layers;

(c) grinding or polishing the non-circuit-forming back surface of the wafer bonded to the support;

(d) processing the non-circuit-forming back surface of the wafer; and (e) delaminating the processed wafer from the support.

When such a method for manufacturing a thin wafer is employed, a thin wafer having a through electrode structure or a bump connection structure can be easily manufactured by using the temporary adhesive material layer in the present invention to bond the wafer to the support.

Advantageous Effects of Invention

In the temporary adhesive material layer in the present invention, the thermosetting siloxane polymer (polymer layer (A)) is used as a supporting layer for bonding the substrate, therefore thermal decomposition of the resin does not occur as a matter of course, and flow of the resin at a high temperature of 200° C. or more also does not occur. Because of the high heat resistance, it can be applied to a wide range of semiconductor film-forming process, and an adhesive material layer with a highly uniform thickness can be formed even on a stepped wafer. By virtue of the uniform thickness of the film, a uniform thin wafer of 50 μm or thinner can be easily manufactured. Moreover, after manufacturing a thin wafer, the wafer can be easily delaminated from the support, for example, at room temperature, so that a fragile thin wafer can be easily manufactured. Further, the present invention is excellent in CVD resistance since the thermosetting siloxane polymer layer (A) is contained therein.

BRIEF DESCRIPTION OF DRAWINGS

FIG. 1 is a cross-sectional view of an exemplary wafer processing laminate of the present invention.

DESCRIPTION OF EMBODIMENTS

Hereinafter, the present invention will be described in detail.

As described above, there has been demanded a temporary adhesive material for a wafer processing which facilitates temporary adhesion, allows to form a layer with uniform film thickness on a heavily stepped substrate, is highly compatible with steps of forming a TSV and forming a wiring on the back surface of the wafer, has excellent resistance to a thermal process for wafer such as CVD, enables easy delamination, and is capable of increasing productivity of thin wafers.

The present inventors earnestly studied to accomplish the above objects and consequently found a method for easily manufacturing a thin wafer having a through electrode structure or a bump interconnect structure by using a complex temporary adhesive material layer that has:

(A) a thermosetting temporary adhesive layer composed of a thermosetting siloxane polymer layer;

(B) a thermosetting temporary adhesive layer composed of a thermosetting polymer layer; and (C) a thermoplastic temporary adhesive layer composed of a thermoplastic resin layer.

FIG. 1 is a cross-sectional view of an exemplary wafer processing laminate of the present invention. As shown in FIG. 1, the wafer processing laminate of the present invention has a wafer (device wafer) 1 having circuit-forming front surface and a back surface to be processed, a support 3 for supporting the wafer 1 at the time of processing the wafer 1, and a temporary adhesive material layer 2 for intervening between the wafer 1 and the support 3. The temporary adhesive material layer 2 includes a thermosetting siloxane polymer layer (A) (first temporary adhesive layer) that is a cured layer of a composition containing the components (A-1) to (A-4) described later, a thermosetting polymer layer (B) (second temporary adhesive layer), and a thermoplastic resin layer (C) (third temporary adhesive layer).

In the following, the wafer processing laminate shown in FIG. 1, i.e., a structure in which the temporary adhesive layers are formed in an order of (C), (A), and (B) from the wafer side is mainly explained, but the wafer processing laminate of the present invention is not limited to the structure in which the layer (C) is formed on the wafer 1 side and the layer (B) is formed on the support 3 side, as shown in FIG. 1. Further, other layer may be formed and included therein.

Also, the temporary adhesive material for a wafer processing of the present invention consists of a laminate having at least the above-mentioned temporary adhesive layers (A), (B), and (C).

Hereinafter, the present invention will be described in more detail, but the present invention is not limited thereto.

[Temporary Adhesive Material Layer]

—First Temporary Adhesive Layer (A)/Thermosetting Siloxane Polymer Layer (Thermosetting Silicone Polymer Layer)—

The thermosetting siloxane polymer layer (A), which is a constitutional component of the wafer processing laminate and the temporary adhesive material for a wafer processing of the present invention, is composed of a thermosetting siloxane polymer, and is a cured layer of a composition containing the following components (A-1) to (A-4). The composition for forming the cured layer preferably contains the component (A-5), if necessary.

(A-1) 100 to 50 parts by mass of an organopolysiloxane having an alkenyl group within its molecule;

(A-2) 0 to 50 parts by mass of an organopolysiloxane having $R^{10}_3SiO_{0.5}$ unit and $SiO_2$ unit with a molar ratio of $R^{10}_3SiO_{0.5}$ unit/$SiO_2$ unit ranging from 0.5 to 1.7, where $R^{10}$ represents a substituted or unsubstituted monovalent hydrocarbon group having 1 to 10 carbon atoms, provided that a total of the components (A-1) and (A-2) is 100 parts by mass and the component (A-2) is contained in amount of more than 0 part by mass;

(A-3) an organohydrogenpolysiloxane having two or more silicon-bonded hydrogen atoms (i.e. Si—H group) per molecule, in such an amount that a molar ratio of the Si—H group in the component (A-3) to the alkenyl group in the component (A-1) ranges from 0.3 to 15;

(A-4) an effective amount of a platinum-based catalyst.

In this case, the thermosetting siloxane polymer layer (A) preferably further contains, as component (A-5), a reaction retarder in an amount of 0.1 to 10 parts by mass based on 100 parts by mass of a total of the components (A-1), (A-2), and (A-3).

Hereinafter, each component will be described.

[Component (A-1)]

The component (A-1) is an organopolysiloxane having an alkenyl group within its molecule. The component (A-1) is preferably a linear or branched organopolysiloxane having an alkenyl group with a ratio of the molar amount of alkenyl group to the molar amount of Si per molecule (molar amount of alkenyl group/molar amount of Si) of 0.3 to 10 mol %. In particular, the organopolysiloxane having an alkenyl group preferably has a ratio of the molar amount of alkenyl group to the molar amount of Si of 0.6 to 9 mol %.

Illustrative examples of the organopolysiloxane include compounds represented by the following general formula (5) and/or (6).

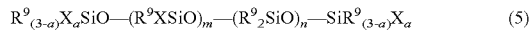

(5)

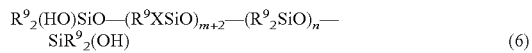

(6)

wherein $R^9$ independently represents a monovalent hydrocarbon group not having an aliphatic unsaturated hydrocarbon group; X independently represents a monovalent organic group having an alkenyl group; and "a" is an integer of 0 to 3. In the formula (5), 2a+m is such a number that the content of alkenyl group is 0.3 to 10 mol % per molecule. In the formula (6), m+2 is such a number that the content of alkenyl group is 0.3 to 10 mol % per molecule. "m" is 0 or a positive number of 500 or less, and "n" is a positive number of 1 to 10000.

In the above formulae, $R^9$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; and aryl groups such as a phenyl group and a tolyl group; and groups. In particular, alkyl groups such as a methyl group or a phenyl group is preferred.

X, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, acryloylmethyl group, and methacryloylpropyl group; (meth)acryloxyalkyl groups such as an acryloxypropyl group, an acryloxymethyl group, a methacryloxypropyl group, a methacryloxymethyl group; and alkenyl group-containing monovalent hydrocarbon groups such as a cyclohexenylethyl group and a vinyloxypropyl group. In particular, a vinyl group is industrially preferred.

In the general formula (5), "a" is an integer of 0 to 3, preferably 1 to 3. This range is preferable since terminals of the molecular chain are blocked with alkenyl groups, and thus the reaction can be completed within a short time by the alkenyl groups with a good reactivity at the terminal of the molecular chain. Further, a=1 is industrially preferred in view of the cost. This alkenyl group-containing organopolysiloxane is preferably in an oil state or a crude rubber state. The alkenyl group-containing organopolysiloxane may be linear or branched. In addition, the component (A-1) may be used in admixture of two or more.

[Component (A-2)]

The component (A-2) is an organopolysiloxane having $R^{10}_3SiO_{0.5}$ unit and $SiO_2$ unit with a molar ratio of $R^{10}_3SiO_{0.5}$ unit/$SiO_2$ unit ranging from 0.5 to 1.7, preferably 0.6 to 1.2, where $R^{10}$ represents a substituted or unsubstituted monovalent hydrocarbon group having 1 to 10 carbon atoms. The thermosetting siloxane polymer layer (A) containing the component (A-2) can maintain a peeling force not only at room temperature but also at high temperature.

Illustrative examples of $R^{10}$ include alkyl groups such as a methyl group, an ethyl group, a propyl group, and a butyl group; cycloalkyl groups; a phenyl group; alkenyl groups such as a vinyl group, an allyl group, and a hexenyl group; and monovalent hydrocarbon groups obtained by substituting a part or whole of hydrogen atoms in these groups with halogen atoms such as fluorine, and a methyl group is preferred.

Typical examples of the component (A-2) include a compound substantially consisting of only $R^{10}_3SiO_{0.5}$ unit and $SiO_2$ unit. When the molar ratio of $R^{10}_3SiO_{0.5}$ unit/$SiO_2$ unit is less than 0.5, there is fear that viscosity and tackiness are lowered, and when it exceeds 1.7, there is fear that viscosity and holding force are lowered. The organopolysiloxane of component (A-2) may contains OH group. The content of OH •group is preferably 4.0% by mass or less.

When the OH group is 4.0% by mass or less, curability is not decreased, so that it is preferable.

The component (A-2) may be used in admixture of two or more. In addition, $R^{10}SiO_{1.5}$ unit and/or $R^{10}{}_2SiO$ unit may be contained in the component (A-2).

The ratio of the component (A-1) to the component (A-2) is preferably in the range of 100/0 to 50/50 (provided that the component (A-2) is contained in amount of more than 0 part by mass), more preferably 99/1 to 60/40. When the formulation amount of the component (A-2) exceeds 50 parts by mass, there is risk of difficulty in delamination.

[Component (A-3)]

The component (A-3) is a crosslinker, an organohydrogenpolysiloxane having two or more silicon-bonded hydrogen atoms (i.e. Si—H group) per molecule. The component (A-3) has at least two, preferably 2 to 100, more preferably 3 to 50 silicon-bonded hydrogen atoms (SiH group) per molecule, and may have linear, branched, or cyclic structure.

The viscosity at 25° C. of the organohydrogen-polysiloxane, component (A-3), is preferably 1 to 5,000 mPa·s, more preferably 5 to 500 mPa·s. The organohydrogenpolysiloxane may be a mixture of two or more kinds thereof.

The component (A-3) is blended such that a molar ratio of the Si—H group in the component (A-3) to the alkenyl group in the component (A-1) (Si—H group/alkenyl group) ranges from 0.3 to 15, preferably 0.3 to 10, more preferably 1.0 to 8.0. When the molar ratio between SiH group and alkenyl group is less than 0.3, there is fear that crosslinking density is lowered, which may cause the problem that the adhesive layer is not cured. When it exceeds 15, there is fear that the crosslinking density becomes too high, and sufficient viscosity and tackiness cannot be obtained. In addition, when the above molar ratio exceeds 15, there is fear that the available time of the solution to be treated cannot be sufficiently maintained.

[Component (A-4)]

The component (A-4) is a platinum-based catalyst (i.e. platinum group metal catalyst). Examples thereof include chloroplatinic acid, an alcohol solution of chloroplatinic acid, a reaction product of chloroplatinic acid with alcohol, a reaction product of chloroplatinic acid with olefin compound, and a reaction product of chloroplatinic acid with vinyl group-containing siloxane.

The adding amount of the component (A-4) is an effective amount, generally 1 to 5,000 ppm, preferably 5 to 2,000 ppm, in terms of (the mass of) platinum based on a total of (A-1), (A-2), and (A-3) (if a later-described component (A-5) is contained, a total of (A-1), (A-2), (A-3), and (A-5)). When it is 1 ppm or more, curability of the composition is not lowered, and crosslinking density and holding force are also not lowered. When it is 0.5% or less, the available time of the solution to be treated can be prolonged.

[Component (A-5)]

The component (A-5) is a reaction retarder. It is optionally added when the composition is prepared or applied to the base in order to prevent thickening viscosity and gelation of the solution to be treated before thermal curing.

Illustrative examples thereof include 3-methyl-1-butyn-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, 1,1,3,3-tetramethyl-1,3-divinyldisiloxane, etc.; 1-ethynylcyclohexanol and 3-methyl-1-butyn-3-ol are preferred.

If the component (A-5) is contained in the composition, the formulation amount thereof is preferably 0.1 to 10 parts by mass, more preferably 0.1 to 8.0 parts by mass, much more preferably 0.1 to 2.0 parts by mass, based on 100 parts by mass of a total of the components (A-1), (A-2), and (A-3). When it is 10 parts by mass or less, curability of the composition containing the components (A-1) to (A-5) is not lowered, and when it is 0.1 part by mass or more, the effect of reaction retarder can be sufficiently exhibited.

The thermosetting siloxane polymer layer (A) may be formed on a thermoplastic resin layer (C) or an uncured thermosetting polymer layer (B) on the support, by applying a solution mixedly containing materials of (A-1) to (A-4) and optional (A-5) by a method such as spin coating and roll coater. If the thermosetting siloxane polymer layer (A) is formed by spin coating or the like, it is preferred to apply a solution of the polymer layer (A). In this case, a hydrocarbon solvent such as pentane, hexane, cyclohexane, isooctane, nonane, decane, p-menthane, pinene, isododecane, and limonene is suitably used. The solvent amount is preferably 100 to 10000 parts by mass based on 100 parts by mass of a total of the components (A-1) to (A-4) and the optional component (A-5) in the thermosetting siloxane polymer. In addition, a known antioxidant may be added to the solution of the polymer layer (A) for enhancing heat resistance.

Moreover, the thermosetting siloxane polymer layer (A) is preferably formed with a film thickness in the range of 0.1 to 30 µm, particularly 1.0 to 15 µm, and used. When the film thickness is 0.1 µm or more, the layer (A) can coat the whole subject without uncoated part. On the other hand, when the film thickness is 30 µm or less, it can withstand the grinding step for thinning the wafer. In addition, to further enhance heat resistance, the thermosetting siloxane polymer layer (A) may contain a filler such as silica in an amount of 50 parts by mass or less based on 100 parts by mass of a total of the components (A-1) to (A-4) and the optional component (A-5) in the thermosetting siloxane polymer.

In addition, it is preferred that after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm. The thermosetting siloxane polymer layer (A) having such peeling forces is preferred since the product becomes more excellent in resistance to a subsequent processing, CVD and enables easy delamination, and there is no fear of causing slippage of the wafer at the time of grinding the wafer.

—Second Temporary Adhesive Layer (B)/Thermosetting Polymer Layer—

The thermosetting polymer layer (B), which is a constitutional element of the wafer processing laminate and the temporary adhesive material for a wafer processing of the present invention, is not particularly limited so long as it is a thermosetting polymer layer, but preferably is a cured layer of the thermosetting composition mainly consisting of the thermosetting siloxane-modified polymer represented by the following general formula (1) and/or (3). The polymer layer (B) may be a combination of the polymers represented by the general formulae (1) and (3). In this case, the (polymerization) ratio of (1):(3) is preferably from 0.1:99.9 to 99.9:0.1, more preferably from 1:99 to 99:1.

Polymer of Formula (1) (Phenolic Siloxane Polymer):

A polymer of the general formula (1) is a siloxane bond-containing polymer, which has a repeating unit represented by the general formula (1) and a weight average molecular weight of 3,000 to 500,000, preferably 10,000 to 100,000,

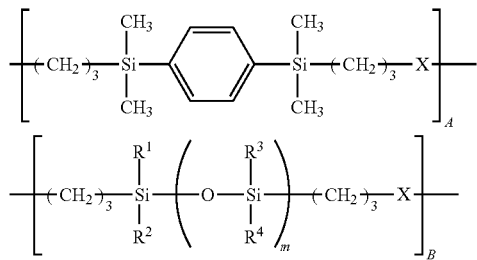

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (2). In this formula, A+B=1, and it is preferred that A is 0 to 0.9 and B is 0.1 to 1. When A is more than 0, it is preferred that A is 0.1 to 0.7 and B is 0.3 to 0.9.

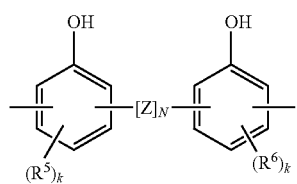

wherein Z represents a divalent organic group selected from any of

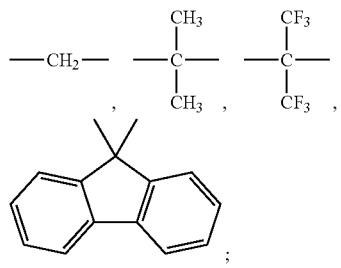

N represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include a methyl group, an ethyl group, and a phenyl group. "m" represents an integer of preferably 3 to 60, more preferably 8 to 40. Also, B/A is from 0 to 20, in particular from 0.5 to 5.

Polymer of Formula (3) (Epoxy-Modified Siloxane Polymer):

A polymer of the general formula (3) is a siloxane bond-containing polymer, which has a repeating unit represented by the general formula (3) and a weight average molecular weight of 3,000 to 500,000,

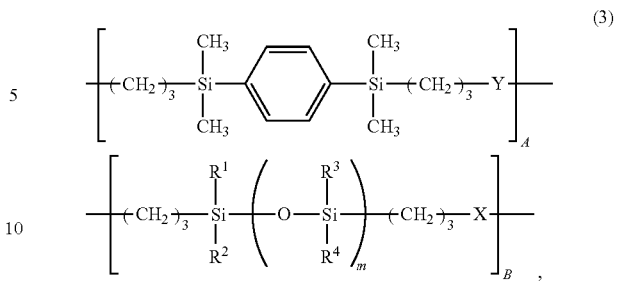

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (4). In this formula, A+B=1, and it is preferred that A is 0 to 0.9 and B is 0.1 to 1. When A is more than 0, it is preferred that A is 0.1 to 0.7 and B is 0.3 to 0.9.

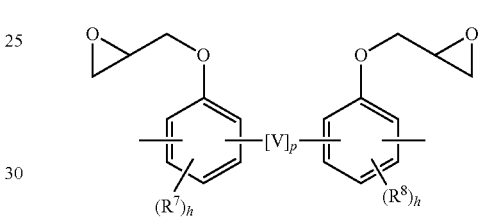

wherein V represents a divalent organic group selected from any of

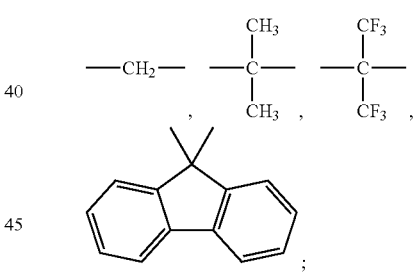

"p" represents 0 or 1; $R^7$ and $R^8$ each represent an alkyl or alkoxy group having 1 to 4 carbon atoms, and may be the same or different from each other; and "h" represents any of 0, 1, and 2.

In this case, illustrative examples of $R^1$ to $R^4$ and "m" are the same as the general formula (1) mentioned above.

The thermosetting composition mainly consisting of the thermosetting siloxane-modified polymer of the general formula (1) and/or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, an amino condensate, a melamine resin, a urea resin each modified with formalin or formalin-alcohol may be exemplified by the following. For example, a melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in admixture of two or more.

Also, a urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in admixture of two or more.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in admixture of two or more.

On the other hand, in the case of the epoxy modified siloxane polymer of the general formula (3), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formula (1) and/or (3) is not particularly limited, and in particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker represented by the following formula may be contained.

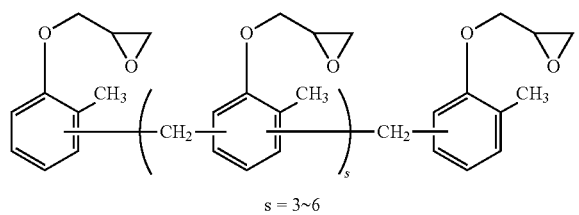

s = 3~6

EOCN-1020

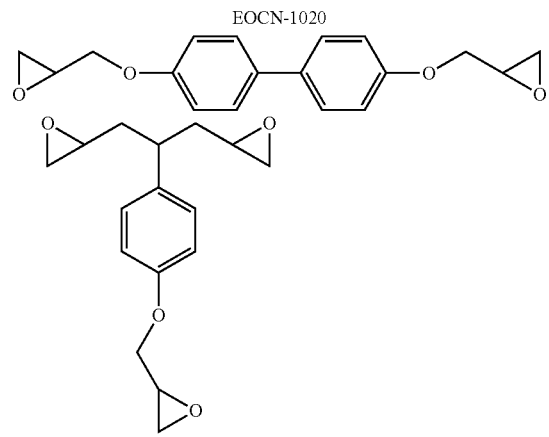

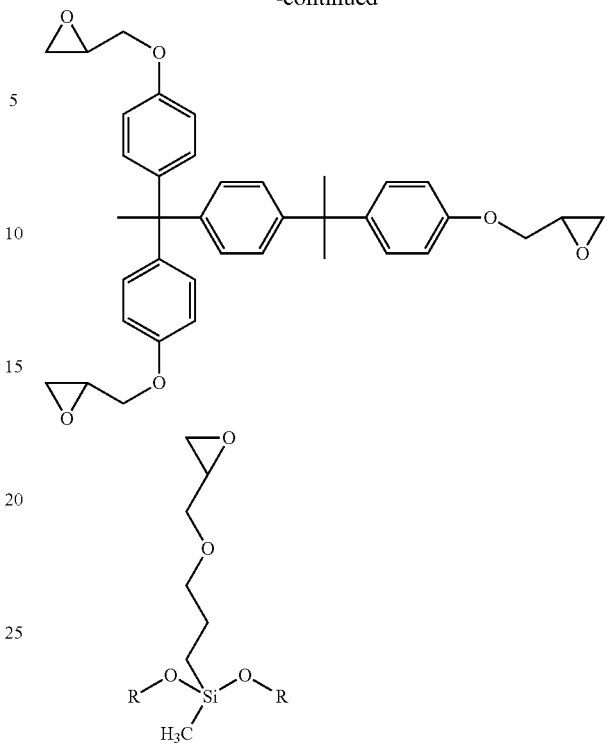

R = methyl group or ethyl group

R = methyl group or ethyl group t = 1  20%
t = 2  75%
t ≥ 3  5%

When the thermosetting polymer is the epoxy-modified siloxane polymer of the general formula (3), as the crosslinker thereof, there may be mentioned a m- or p-series cresol-novolac resin such as EP-6030G available from Asahi Organic Chemicals Industry Co., Ltd., tri-functional phenol compound such as Tris-P-PA4 available from Honshu Chemical Industry Co., Ltd., and tetra-functional phenol compound such as TEP-TPA available from Asahi Organic Chemicals Industry Co., Ltd., etc.

The formulation amount of the crosslinker is 0.1 to 50 parts by mass, preferably 0.1 to 30 parts by mass, more preferably 1 to 20 parts by mass based on 100 parts by mass of the thermosetting polymer, and it may be formulated in admixture of two or more.

A curing catalyst such as an acid anhydride may be added in an amount of 10 parts by mass or less based on 100 parts by mass of the thermosetting polymer.

Also, this composition (thermosetting polymer) may be dissolved in a solvent, and applied to the support specifically by a method such as spin coating, roll coater, and die coater, to form a layer. In such a case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in admixture of two or more. The solvent amount is preferably 40 to 150 parts by mass based on 100 parts by mass of the thermosetting polymer.

Incidentally, a known antioxidant, a filler such as silica, may be added in an amount of 50 parts by mass or less based on 100 parts by mass of the thermosetting polymer to further enhance heat resistance. Moreover, a surfactant may be added to improve coating uniformity.

Illustrative examples of the antioxidant that can be added into the polymer layer (B) include hindered phenol-based compounds such as tetrakis[methylene-(3,5-di-tert-butyl-4-hydroxyhydrocinnamate)]methane (trade name: Adekastab AO-60).

The thermosetting polymer layer (B) composed of the thermosetting polymer may be formed on the support so as to have a film thickness after curing of 15 to 150 μm, more preferably 20 to 120 μm, depending on the steps at the wafer side. When the film thickness is 15 μm or more, it can sufficiently withstand the grinding step for thinning the wafer, and when it is 150 μm or less, there is no fear of generating resin deformation in the heat treatment step such as TSV formation step, and it can endure for practical use, so that it is preferable.

—Third Temporary Adhesive Layer (C)/Thermoplastic Resin Layer (Thermoplastic Polymer Layer)—

The third temporary adhesive layer (C) is composed of a thermoplastic resin. In view of applicability to the stepped silicon wafer, etc., a thermoplastic resin having a good spin coating property is suitably used as a material for forming the third temporary adhesive layer (C). In particular, a thermoplastic resin having a glass transition temperature of about −80° C. to 120° C. is preferred. Examples thereof include an olefin type thermoplastic elastomer, a polybutadiene type thermoplastic elastomer, a styrene type thermoplastic elastomer, a styrene/butadiene type thermoplastic elastomer, a styrene/polyolefin type thermoplastic elastomer, etc., in particular, a hydrogenated polystyrene type elastomer excellent in heat resistance is suitable. More specifically, there may be mentioned Tuftec (Asahi Kasei Chemicals Corporation), ESPOLEX SB type (Sumitomo Chemical Co., Ltd.), RABALON (Mitsubishi Chemical Corporation), SEPTON (Kuraray Co., Ltd.), DYNARON (JSR), etc. In addition, there may be mentioned a cycloolefin polymer represented by ZEONEX (ZEON Corporation) and a cyclic olefin copolymer represented by TOPAS (Nippon Polyplastics Co., Ltd.).

As descried above, the thermoplastic resin layer (C) is preferably a thermoplastic elastomer.

This enables a thin wafer to be easily delaminated from the support after manufacturing the wafer. Thus, a fragile thin wafer can be easily handled.

The thermoplastic resin layer is formed by dissolving the resin in a solvent, and applying the solution on a semiconductor substrate such as a silicon wafer by means of spin coating or spray coating, etc. Examples of the solvent include hydrocarbon solvents, preferably nonane, p-menthane, pinene, isooctane, etc. Nonane, p-menthane, and isooctane are more preferred because of their coating properties. The solvent amount is preferably 300 to 3500 parts by mass based on 100 parts by mass of the thermoplastic resin.

The thickness of the film to be formed is not limited, but the resin film is desirably formed depending on the steps on the substrate, preferably with a film thickness of 0.5 micron to 50 microns, more preferably 0.5 to 20 μm. In addition, to the thermoplastic resin may be added an antioxidant for the purpose of improving heat resistance, or a surfactant for the purpose of improving coating property. Illustrative examples of the usable antioxidant suitably include di-t-butylphenol, etc. Examples of the usable surfactant suitably include a fluorine-containing silicone type surfactant X-70-1102 (available from Shin-Etsu Chemical Co., Ltd.), etc.

[Method for Manufacturing a Thin Wafer]

The method for manufacturing a thin wafer of the present invention is characterized by using the temporary adhesive material for a wafer processing of the present invention, that is, the complex temporary adhesive material layer including the thermosetting siloxane polymer layer (A), the thermosetting polymer layer (B), and the thermoplastic resin layer, as the layer for bonding the support to the wafer having a semiconductor circuit, etc. The thickness of a thin wafer obtained by the manufacturing method of the present invention is typically 5 to 300 μm, more typically 10 to 100 μm.

The method for manufacturing a thin wafer of the present invention has the steps of (a) to (e).

[Step (a)]

The step (a) is a step of bonding a support to a circuit-forming front surface of a wafer that has the circuit-forming front surface and a non-circuit-forming back surface through the complex temporary adhesive material.

The wafer that has a circuit-forming front surface and a non-circuit-forming back surface is a wafer one of the surfaces of which is a circuit-forming surface, and the other surface of which is a non-circuit-forming surface. The wafer to which the present invention can be applied is generally a semiconductor wafer. Examples of the semiconductor wafer include not only a silicon wafer, but also a germanium wafer, a gallium-arsenic wafer, a gallium-phosphorus wafer, a gallium-arsenic-aluminum wafer, etc. The thickness of the wafer is not particularly limited, but typically 600 to 800 μm, more typically 625 to 775 μm.

As the support, a substrate such as a silicon wafer, a glass plate, and a quartz wafer can be used, but it is not particularly limited. In the present invention, it is not necessary to irradiate an energy beam to the temporary adhesive material layer through the support, so that the support does not require light transmittance.

Each of the temporary adhesive layers (A), (B), and (C) may be formed as a film on the wafer or the support, or may be formed by applying the solution to the wafer or the support by a method such as spin coating and roll coater. In this case, after spin coating, the layers are prebaked at 80 to 200° C., preferably 100 to 180° C., depending on the volatile conditions of the used solvent, and then used. The temporary adhesive layer (A) is cured with the evaporation of the solvent by prebaking, and then used.

Also, as mentioned above, in the present invention, it is possible to produce a laminate in which the temporary adhesive layers are laminated on the wafer or the support in an order of (C), (A), and (B), and then bond the laminate to the support or the wafer. However, it is preferable to select a method in which a laminate obtained by laminating the temporary adhesive layers on the wafer in an order of (C) and (A) is bonded to a laminate obtained by laminating the temporary adhesive layer (B) on the support, or a method in which a laminate obtained by laminating the temporary adhesive layer (C) on the wafer is bonded to a laminate obtained by laminating the temporary adhesive layers on the support in an order of (B) and (A). In these cases, each temporary adhesive layer may be formed by applying the solution containing the material of each temporary adhesive layer to the wafer or the support, or may be formed as a film on the wafer or the support. In the case of a film, constitutional components of the present invention may be formed on a protective film such as polyethylene, polyester, etc., and then used by removing the protective film.

The wafer and the support on which the temporary adhesive layers (A), (B), and (C) have been formed are formed as a substrate that is bonded via the layers (A), (B), and (C). At this time, this substrate is adhered by uniform compression under reduced pressure at a temperature ranging preferably from 40 to 200° C., more preferably from 60 to 180° C., thereby forming a wafer processing laminate (laminated substrate) in which the wafer are bonded to the support.

Examples of a wafer bonding apparatus include a commercially available wafer bonding apparatus, such as EVG520IS and 850 TB manufactured by EV Group, and XBC300 manufactured by SUSS MicroTec AG.

[Step (b)]

The step (b) is a step of thermally curing the polymer layers (A) and (B). After forming the above-mentioned wafer processing laminate (laminated substrate), it is heated at 120 to 220° C., preferably 150 to 200° C., for 10 minutes to 4 hours, preferably 30 minutes to 2 hours, to cure the polymer layers (A) and (B).

[Step (c)]

Step (c) is a step of grinding or polishing the non-circuit-forming back surface of the wafer bonded to the support, in other words, a step of grinding or polishing the wafer processing laminate obtained by bonding in the step (a) from the wafer back surface side to reduce the thickness of the wafer. The technique for grinding the wafer back surface is not particularly limited, and conventionally known grinding techniques may be used. The grinding is preferably performed while feeding water to the wafer and a grinding wheel (e.g. diamond) for cooling. Examples of an apparatus for grinding the wafer back surface include DAG-810 (trade name) manufactured by DISCO Co., Ltd. Also, the wafer back surface side may be subjected to CMP polishing.

[Step (d)]

Step (d) is a step of processing the non-circuit-forming surface of the wafer processing laminate which has been ground, i.e., the non-circuit-forming surface of the wafer processing laminate which has been thinned by grinding the back surface. This step includes various processes applied in the wafer level, for example, electrode formation, metal wiring formation, protective film formation, etc. More specifically, there may be mentioned well-known processes such as metal sputtering for forming electrodes and so on, wet etching for etching a sputtered metal layer, patterning process in which a resist is applied and subjected to exposure and development to form a pattern used as a mask for metal wiring formation, resist removal, dry etching, formation of a metal plating, silicon etching to form a TSV, and formation of an oxide film on silicon surface.

[Step (e)]

Step (e) is a step of delaminating the wafer processed in the step (d) from the support, in other words, a step of delaminating the wafer before dicing from the support after the thinned wafer is subjected to various processes. This delaminating step is generally carried out under relatively low temperature conditions from room temperature to about 60° C. Examples thereof include a method in which either of the wafer or the support of the wafer processing laminate is horizontally fixed, and the other is lifted at a certain angle with respect to the horizontal direction; and a method in which a protective film is adhered to the ground surface of the wafer, and then the wafer and the protective film are delaminated from the wafer processing laminate by peeling.

To the present invention, either of these delaminating methods can be applied, but it is not limited to these method. These delaminating methods are usually carried out at room temperature.

EXAMPLES

In the following, the present invention will be specifically described with reference to Examples and Comparative example, but the present invention is not limited to these Examples.

Resin Synthetic Example 1

In a flask equipped with a stirrer, a thermometer, a nitrogen purge system, and a reflux condenser were placed 43.1 g of 9,9'-bis(3-allyl-4-hydroxyphenyl)fluorene (M-1), 29.5 g of organohydrogensiloxane having average structural formula (M-3), 135 g of toluene, and 0.04 g of chloroplatinic acid, and the resulting mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50% by mass. When the molecular weight of the resin in the solution was measured by GPC, the weight average molecular weight was 45,000 in terms of polystyrene. Further, to 50 g of the resin solution were added 7.5 g of epoxy crosslinker, EOCN-1020 available from NIPPON KAYAKU Co., Ltd. as a crosslinker, 0.2 g of BSDM (bis(tert-butylsulfonyl)diazomethane) available from Wako Pure Chemical Industries Ltd. as a curing catalyst, and 0.1 g of tetrakis[methylene-(3,5-di-tert-butyl-4-hydroxyhydrocinnamate)]methane (trade name: Adekastab AO-60) as an antioxidant, and the solution was filtered through 1 μm of a membrane filter to obtain a resin solution (B-1).

Resin Synthetic Example 2

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the resulting mixture was heated at 60° C. Thereafter, 1 g of carbon carried platinum catalyst (5% by mass) was added thereto, and after confirming that the internal reaction temperature was increased to 65 to 67° C., the mixture was further heated to 90° C., and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60% by mass. When the molecular weight of the resin in the resin solution was measured by GPC, the weight average molecular weight was 28,000 in terms of polystyrene. Further, to 100 g of the resin solution were added 9 g of a tetra-functional phenol compound, TEP-TPA (available from Asahi Organic Chemicals Industry Co., Ltd.), and 0.2 g of tetrahydrophthalic anhydride (available from New Japan Chemical Co., Ltd., RIKACID HH-A), and the solution was filtered through 1 µm of a membrane filter to obtain a resin solution (B-2).

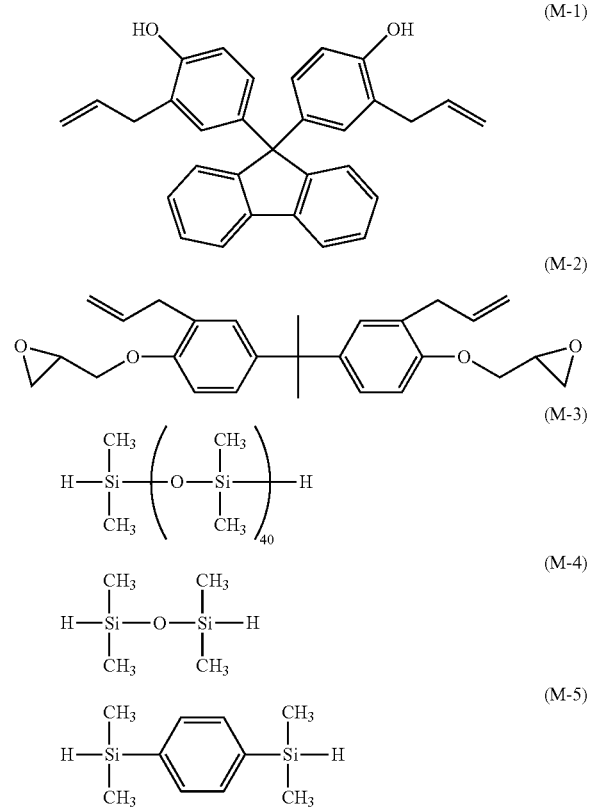

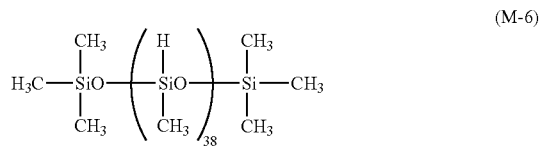

Resin Solution Production Example 1

To a solution consisting of 85 parts by mass of polydimethylsiloxane in which 2.0 mol % vinyl group is contained at both terminals and side chain, molecular terminals are blocked with SiMe$_2$Vi groups, and number average molecular weight (Mn) by GPC is 50,000, 15 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 3 parts (2 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 µm of a membrane filter to obtain a thermosetting siloxane polymer solution (A-1).

Resin Solution Production Example 2

To a solution consisting of 85 parts by mass of polydimethylsiloxane in which 3.0 mol % vinyl group is contained at both terminals and side chain, molecular terminals are blocked with SiMe$_2$Vi groups, and number average molecular weight (Mn) by GPC is 50,000, 15 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 11 parts (5 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 µm of a membrane filter to obtain a thermosetting siloxane polymer solution (A-2).

Resin Solution Production Example 3

To a solution consisting of 80 parts by mass of polydimethylsiloxane in which 2.0 mol % vinyl group is contained at both terminals and side chain, molecular terminals are blocked with SiMe$_2$Vi groups, and number average molecular weight (Mn) by GPC is 100,000, 20 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 11 parts (8 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 µm of a membrane filter to obtain a thermosetting siloxane polymer solution (A-3).

Resin Solution Production Example 4

To a solution consisting of 97 parts by mass of polydimethylsiloxane in which 5.0 mol % vinyl group is contained at both terminals and side chain, molecular terminals are blocked with SiMe$_2$Vi groups, and number average molecular weight (Mn) by GPC is 50,000, 3 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 20 parts (5 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 μm of a membrane filter to obtain a thermosetting siloxane polymer solution (A-4).

Resin Solution Production Example 5

To a solution consisting of 30 parts by mass of polydimethylsiloxane in which 5.0 mol % vinyl group is contained at both terminals and side chain, molecular terminals are blocked with SiMe$_2$Vi groups, and number average molecular weight (Mn) by GPC is 30,000, 55 parts by mass of polydimethylsiloxane in which 1.0 mol % vinyl group is contained at both terminals and side chain, molecular terminals are blocked with SiMe$_2$Vi groups, and number average molecular weight (Mn) by GPC is 100,000, 15 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 15 parts (8 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 μm of a membrane filter to obtain a thermosetting siloxane polymer solution (A-5).

Resin Solution Production Example 6

To a solution consisting of 70 parts by mass of polydimethylsiloxane in which 2.0 mol % vinyl group is contained at both terminals and side chain, molecular terminals are blocked with SiMe$_2$Vi groups, and number average molecular weight (Mn) by GPC is 200,000, 30 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 7 parts (6 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 μm of a membrane filter to obtain a thermosetting siloxane polymer solution (A-6).

Resin Solution Production Example 7

To a solution consisting of 85 parts by mass of polydimethylsiloxane in which 3.0 mol % vinyl group is contained at both terminals and side chain, molecular terminals are blocked with SiMe$_2$Vi groups, and number average molecular weight (Mn) by GPC is 30,000, 15 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 27 parts (12 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) was added thereto, and the mixture was filtered through 0.2 μm of a membrane filter to obtain a thermosetting siloxane polymer solution (A-7).

Resin Solution Production Example 8

24 g of a thermoplastic resin, SEPTON4033 (hydrogenated styrene-isoprene-butadiene copolymer available from Kuraray Co., Ltd., Tg: about 25° C.) was dissolved in 176 g of isononane to obtain an isononane solution containing 12% by mass of SEPTON4033. The obtained solution was filtered through 0.2 μm of a membrane filter to obtain an isononane solution of the thermoplastic resin (C-1).

Comparative Synthetic Example 1

In a four-necked flask, 90 parts of a crude rubber state dimethylpolysiloxane represented by the formula (7) both molecular terminals of which are blocked with hydroxyl groups and a 30% toluene solution of which has a viscosity at 25° C. of 98,000 mPa·s, and 10 parts of methylpolysiloxane resin composed of 0.75 mol of (CH$_3$)$_3$SiO$_{o.5}$ unit and 1 mol of SiO$_2$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensed product. 900 parts of toluene was added to 100 parts of the partially condensed product to dissolve the product. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent, etc., were removed to obtain a solidified non-reactive partially condensed product. Moreover, after adding 900 parts of hexane to 100 parts of the non-reactive partially condensed product to dissolve the product, the solution was added to 2000 parts of acetone, and the precipitated resin was collected. Thereafter, hexane, etc., were removed under vacuum to obtain a dimethylpolysiloxane polymer having a weight average molecular weight of 900,000 and containing 0.05% by mass of a low molecular weight component having a molecular weight of 740 or less.

20 g of this polymer was dissolved in 80 g of isododecan, and the solution was filtered through 0.2 μm of a membrane filter to obtain an isododecane solution of the dimethylpolysiloxane polymer (A-8).

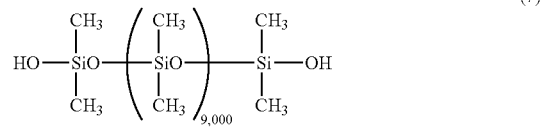

(7)

Comparative Solution Production Example 1

To a solution consisting of 30 parts by mass of polydimethylsiloxane in which 7 mol % vinyl group is contained at both terminals and side chain, molecular terminals are blocked with SiMe$_2$Vi groups, and number average molecular weight (Mn) by GPC is 50,000, 70 parts of polysiloxane composed of Me$_3$SiO$_{0.5}$ unit and SiO$_2$ unit (Me$_3$SiO$_{0.5}$ unit/SiO$_2$ unit (molar ratio)=0.80), and 400 parts by mass of isododecane were added 15 parts (8 mol per the alkenyl group) of organohydrogenpolysiloxane represented by the formula (M-6) and 0.7 part of ethynylcyclohexanol, and then mixed. Further, 0.5 part of a platinum catalyst CAT-PL-5 (available from Shin-Etsu Chemical Co., Ltd.) added thereto, and the mixture was filtered through 0.2 μm of a membrane filter to obtain a thermosetting siloxane polymer solution (A-9).

Example 1

Onto a 200-mm silicon wafer (thickness: 725 μm) whose entire surface was formed with copper posts having height of 10 μm and diameter of 40 μm, the resin solution (C-1) was applied by spin coating, and then heated on a hot plate at 150° C. for 5 minutes to form a film corresponding to the layer (C) having a film thickness shown in Table 1 on the bump-formed surface of the wafer. Then, the thermosetting siloxane polymer solution (A-1) was applied by spin coating onto the layer (C) formed on the silicon wafer to form a film corresponding to the layer (A) having a film thickness shown in Table 1. Thereafter, the wafer was heated on a hot plate at 150° C. for 3 minutes. On the other hand, a glass plate having a diameter of 200 mm (thickness: 500 μm) was used as a support, and onto the glass support was applied the polymer solution (B-1) by spin coating, and then heated at 150° C. for 5 minutes on a hot plate to form a film corresponding to the layer (B) having a film thickness shown in Table 1. The silicon wafer having the layer (C) composed of a thermoplastic resin and the layer (A) formed on the layer (C) was bonded to the glass plate having the thermosetting polymer layer (B) so that the respective resin surfaces faced each other, in a vacuum adhesion equipment under the conditions shown in Table 1, thereby preparing a wafer processing laminate. Evaluation results are shown in Table 1.

Examples 2 to 7 and Comparative Examples 1 and 2

Examples 2 to 7 and Comparative examples 1 and 2 were also handled in the same manner as in Example 1 under the conditions shown in Table 1. Evaluation results are shown in Table 1.

Example 8

Onto a 200-mm silicon wafer (thickness: 725 μm) whose entire surface was formed with copper posts having height of 10 μm and diameter of 40 μm, the resin solution (C-1) was applied by spin coating, and then heated on a hot plate at 150° C. for 5 minutes to form a film corresponding to the layer (C) having a film thickness shown in Table 2 on the bump-formed surface of the wafer. On the other hand, a glass plate having a diameter of 200 mm (thickness: 500 μm) was used as a support, and first, onto the glass support was applied the polymer solution (B-2) by spin coating, and then heated at 150° C. for 5 minutes on a hot plate to form a film corresponding to the layer (B) having a film thickness shown in Table 2. Then, the thermosetting siloxane polymer solution (A-1) was applied by spin coating onto the layer (B) formed on the glass plate to form a film corresponding to the layer (A) having a film thickness shown in Table 2. Thereafter, the glass plate was heated on a hot plate at 150° C. for 3 minutes. The silicon wafer having the layer (C) composed of a thermoplastic resin was bonded to the glass plate having the thermosetting polymer layer (B) and the layer (A) formed on the layer (B) so that the respective resin surfaces faced each other, in a vacuum adhesion equipment under the conditions shown in Table 2, thereby preparing a wafer processing laminate. Evaluation results are shown in Table 2.

Example 9

Example 9 was also handled in the same manner as in Example 8 under the conditions shown in Table 2. Evaluation results are shown in Table 2.

Interface to be bonded when the wafer processing laminate is manufactured was defined as "bonding interface", and shown in Tables 1 and 2. For example, when bonding is performed between the layer (A) on the wafer side and the layer (B) on the support side, the bonding interface is expressed as "A/B".

Herein, a glass plate was used as a support for the purpose of visually observing abnormalities after adhering the substrate, but a substrate such as a wafer, which does not transmit light, can be also used.

Thereafter, the bonded substrate was subjected to following tests. The results of Examples and Comparative examples are shown in Tables 1 and 2. Evaluations were carried out in an order mentioned below, however, when the subject was judged as "poor" during the tests, the evaluation thereafter was stopped.

—Adhesiveness Test—

The wafer with a diameter of 200 mm was bonded by using a wafer bonding apparatus EVG520IS manufactured by EV group. The bonding was carried out at adhesion temperature shown in Tables 1 and 2, under a chamber internal pressure during bonding of $10^{-3}$ mbar or less, with a load of 5 kN. After bonding, the substrate was once heated in an oven at 180° C. for 1 hour to cure the layers (A) and (B). After cooling to room temperature, the adhesion state of the interface was visually observed. When no abnormality like bubbles was found at the interface, the sample was evaluated as good, and shown with "good". When abnormalities were found, the sample was evaluated as poor, and shown with "poor".

—Back Surface Grinding Resistance Test—

The back surface of the silicon wafer was ground by a grinder (DAG810 manufactured by DISCO Co., Ltd.) using a diamond grinding wheel. After the wafer was ground to a final substrate thickness of 50 μm, abnormalities such as crack and peeling were checked by an optical microscope (100-folds). When no abnormality was found, the sample was shown with "good", when a subsequent process can proceed although several abnormalities were found, the sample was shown with "moderate", and when abnormalities were widely found, the sample was shown with "poor".

—CVD Resistance Test—

After the back surface of the silicon wafer had been ground, the laminate was put into a CVD apparatus, and subjected to a test of forming a $SiO_2$ film 2 μm thick to check abnormalities in appearance at that time. When no appearance abnormality was found, the sample was shown with "good", when a subsequent process can proceed although several abnormalities such as voids and swelling of the wafer were found, the sample was shown with "moderate", and when voids, swelling of the wafer, breakage of the wafer, etc., were widely found, the sample was shown with "poor". The conditions of the CVD resistance test are as follows.

Apparatus: Plasma CVD PD270STL (manufactured by SAMCO Inc.)

RF: 500 W, internal pressure: 40 Pa TEOS (tetraethyl orthosilicate): $O_2$=20 sccm: 680 sccm —Heat Resistance Test—

After the back surface of the silicon wafer had been ground, the laminate was placed in an oven under nitrogen atmosphere at 220° C. for 2 hours, followed by heating on a hot plate at 260° C. for 20 minutes. Then, abnormalities in appearance of the laminate was checked. When no appearance abnormality was found, the sample was shown with "good", when voids and swelling of the wafer were partially found, the sample was shown with "moderate", and when voids, swelling of the wafer, breakage of the wafer, etc., were widely found, the sample was shown with "poor".

—Delaminatability Test—

Delaminatability of the substrate was evaluated in the following manner. First, a dicing tape was attached onto the wafer side of the wafer processing laminate that had been thinned to 50 μm and subjected to the CVD resistance test, by using a dicing frame. This dicing tape surface was set to a suction plate by vacuum suction. Then, one point of the glass was lifted by tweezers at room temperature to delaminate the glass substrate. When it could be delaminated without cracking the 50-μm wafer, the sample was shown with "good", and when abnormalities such as cracking occur, the sample was evaluated as poor, and shown with "poor".

—Delamination Interface—

In the delaminatability test, the temporary adhesive layers on the delaminated surfaces of the wafer side and support side was defined as "delamination interface". For example, when the layer (A) is on the wafer side and the layer (B) is on the support side, it is expressed as "A/B".

—Peeling Force Test—

Onto a 200-mm silicon wafer (thickness: 725 μm), the material corresponding to the layer (A) was applied by spin coating, and then heated on a hot plate at 150° C. for 3 minutes to form a film having a film thickness of 2 μm on the bump-formed surface of the wafer. Then, the thermosetting polymer solution corresponding to the layer (B) was applied by spin coating onto the layer (A) formed on the silicon wafer, and then heated on a hot plate at 150° C. for 5 minutes to form a film having a film thickness shown in Table 1. Thereafter, the layers were cured in an oven at 180° C. for 1 hour.

Then, five polyimide tapes with a length of 150 mm and a width of 25 mm were attached to the layer (B) on the wafer, and a part of the temporary adhesive layer to which no tape has been attached was removed. By using AUTOGRAPH (AG-1) manufactured by Shimadzu Co., 120 mm of the tapes were peeled off from one end thereof by 180° peeling at a speed of 300 mm/minute at 25° C., and an average force applied at that time (120 mm stroke×5 times) was measured as a peeling force (at 25° C.) between the temporary adhesive layers (A/B). In addition, 120 mm of the tapes were peeled off from one end thereof by 180° peeling at a speed of 300 mm/minute at 180° C., and an average force applied at that time (120 mm stroke×5 times) was measured as a peeling force (at 180° C.) between the temporary adhesive layers (A/B).

Onto a 200-mm silicon wafer (thickness: 725 μm), the material corresponding to the layer (C) was applied by spin coating, and then heated on a hot plate at 150° C. for 5 minutes to form a film having a film thickness shown in Table 2 on the bump-formed surface of the wafer. Then, the thermosetting siloxane polymer solution corresponding to the layer (A) was applied by spin coating onto the layer (C) formed on the silicon wafer, and then heated on a hot plate at 150° C. for 3 minutes to form a film having a film thickness shown in Table 2. Thereafter, the layer was cured in an oven at 180° C. for 1 hour.

Then, five polyimide tapes with a length of 150 mm and a width of 25 mm were attached to the layer (A) on the wafer, and a part of the temporary adhesive layer to which no tape has been attached was removed. By using AUTOGRAPH (AG-1) manufactured by Shimadzu Co., 120 mm of the tapes were peeled off from one end thereof by 180° peeling at a speed of 300 mm/minute at 25° C., and an average force applied at that time (120 mm stroke×5 times) was measured as a peeling force (at 25° C.) between the temporary adhesive layers (C/A). In addition, 120 mm of the tapes were peeled off from one end thereof by 180° peeling at a speed of 300 mm/minute at 180° C., and an average force applied at that time (120 mm stroke×5 times) was measured as a peeling force (at 180° C.) between the temporary adhesive layers (C/A).

TABLE 1

|  | Example 1 | Example 2 | Example 3 | Example 4 | Example 5 | Example 6 | Example 7 | Comparative example 1 | Comparative example 2 |
|---|---|---|---|---|---|---|---|---|---|
| Polymer layer (A) | A-1 | A-2 | A-3 | A-4 | A-5 | A-6 | A-7 | A-8 | A-9 |
| Film thickness of layer (A) | 5 μm | 8 μm | 10 μm | 15 μm | 8 μm | 15 μm | 2 μm | 10 μm | 5 μm |
| Peeling force of layers (A/B) (at 25° C.) | 10 gf | 15 gf | 20 gf | 8 gf | 30 gf | 40 gf | 25 gf | 10 gf | 80 gf |
| Peeling force of layers (A/B) (at 180° C.) | 6 gf | 8 gf | 16 gf | 4 gf | 20 gf | 25 gf | 5 gf | 1 gf | 40 gf |
| Maintenance ratio of peeling force at 180° C. | 60% | 53% | 80% | 50% | 67% | 63% | 20% | 10% | 50% |
| Polymer layer (B) | B-1 | B-2 | B-1 | B-1 | B-2 | B-1 | B-1 | B-1 | B-2 |
| Film thickness of layer (B) | 60 μm | 50 μm | 60 μm | 60 μm | 50 μm | 60 μm | 60 μm | 60 μm | 50 μm |
| Resin layer (C) | C-1 | C-1 | C-1 | C-1 | C-1 | C-1 | C-1 | C-1 | C-1 |

TABLE 1-continued

| | Example 1 | Example 2 | Example 3 | Example 4 | Example 5 | Example 6 | Example 7 | Comparative example 1 | Comparative example 2 |
|---|---|---|---|---|---|---|---|---|---|
| Film thickness of layer (C) | 5 μm | 5 μm | 5 μm | 5 μm | 5 μm | 5 μm | 5 μm | 5 μm | 5 μm |
| Bonding interface | A/B | A/B | A/B | A/B | A/B | A/B | A/B | A/B | A/B |
| Adhesion temperature | 120° C. | 140° C. | 120° C. | 120° C. | 140° C. | 120° C. | 120° C. | 120° C. | 140° C. |
| Adhesiveness | good | good | good | good | good | good | good | good | good |
| Back surface grinding resistance | good | good | good | good | good | good | good | moderate | moderate |
| CVD resistance | good | good | good | good | good | good | moderate | poor | moderate |
| Heat resistance | good | good | good | good | good | good | moderate | poor | poor |
| Delaminatability | good | good | good | good | good | good | good | — | poor |
| Delamination interface | A/B | A/B | A/B | A/B | A/B | A/B | A/B | — | — |

TABLE 2

| | Example 8 | Example 9 |
|---|---|---|
| Polymer layer (A) | A-1 | A-3 |
| Film thickness of layer (A) | 5 μm | 10 μm |
| Peeling force of layers (C/A) (at 25° C.) | 7 gf | 15 gf |
| Peeling force of layers (C/A) (at 180° C.) | 5 gf | 10 gf |
| Maintenance ratio of peeling force at 180° C. | 71% | 67% |
| Polymer layer (B) | B-2 | B-1 |
| Film thickness of layer (B) | 50 μm | 60 μm |
| Resin layer (C) | C-1 | C-1 |
| Film thickness of layer (C) | 5 μm | 5 μm |
| Bonding interface | C/A | C/A |
| Adhesion temperature | 140° C. | 120° C. |
| Adhesiveness | good | good |
| Back surface grinding resistance | good | good |
| CVD resistance | good | good |
| Heat resistance | good | good |
| Delaminatability | good | good |
| Delamination interface | C/A | C/A |

As shown in Tables 1 and 2, it could be clarified that Examples 1 to 9, which satisfy the requirements of the present invention, facilitate temporary adhesion and delamination, and particularly, is excellent in CVD resistance and heat resistance. On the other hand, in Comparative example 1, where the layer (A) does not satisfy the requirements of the present invention, was poor in CVD resistance, and Comparative example 2, where the formulation amount of the component (A-2) does not satisfy the requirements of the present invention, failed in heat resistance and delaminatability.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A temporary adhesive material for a wafer processing, the temporary adhesive material being used for temporarily bonding a support to a wafer having a circuit-forming front surface and a back surface to be processed, comprising a complex temporary adhesive material layer that has a first temporary adhesive layer composed of a thermosetting siloxane polymer layer (A), a second temporary adhesive layer composed of a thermosetting polymer layer (B) laminated on one surface of the first temporary adhesive layer, and a third temporary adhesive layer composed of a thermoplastic resin layer (C) laminated on the other surface of the first temporary adhesive layer, wherein
the thermosetting siloxane polymer layer (A) is a cured layer of a composition containing:
(A-1) 100 to 50 parts by mass of an organopolysiloxane having an alkenyl group within its molecule;
(A-2) 0 to 50 parts by mass of an organopolysiloxane having $R^{10}_3SiO_{0.5}$ units and $SiO_2$ units with a molar ratio of $R^{10}_3SiO_{0.5}$ unit/$SiO_2$ unit in the range of from 0.5 to 1.7, where $R^{10}$ represents a substituted or unsubstituted monovalent hydrocarbon group having 1 to 10 carbon atoms, provided that a total of the components (A-1) and (A-2) is 100 parts by mass and the component (A-2) is contained in amount of more than 0 parts by mass;
(A-3) an organohydrogenpolysiloxane having two or more silicon-bonded hydrogen atoms (i.e. Si—H group) per molecule, in such an amount that a molar ratio of the Si—H group in the component (A-3) to the alkenyl group in the component (A-1) in the range of from 0.3 to 15; and
(A-4) an effective amount of a platinum-based catalyst; and
the thermoplastic resin layer (C) is composed of a thermoplastic resin, the thermoplastic resin being one or more selected from the group consisting of
an olefin thermoplastic elastomer,
a polybutadiene thermoplastic elastomer,
a styrene thermoplastic elastomer,
a styrene/butadiene thermoplastic elastomer, and
a styrene/polyolefin thermoplastic elastomer.

2. The temporary adhesive material for a wafer processing according to claim 1, wherein the thermosetting siloxane polymer layer (A) further contains (A-5) a reaction retarder in an amount of 0.1 to 10 parts by mass based on 100 parts by mass of a total of the components (A-1), (A-2), and (A-3).

3. The temporary adhesive material for a wafer processing according to claim 2, wherein after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm.

4. The temporary adhesive material for a wafer processing according to claim 1, wherein after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm.

5. The temporary adhesive material for a wafer processing according to claim 1, wherein the thermosetting polymer layer (B) is a cured layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of
- an amino condensate modified with formalin or formalin-alcohol,
- a melamine resin modified with formalin or formalin-alcohol,
- a urea resin modified with formalin or formalin-alcohol,
- a phenol compound having on average two or more methylol or alkoxymethylol groups per molecule, and
- an epoxy compound having on average two or more epoxy groups per molecule, (1)

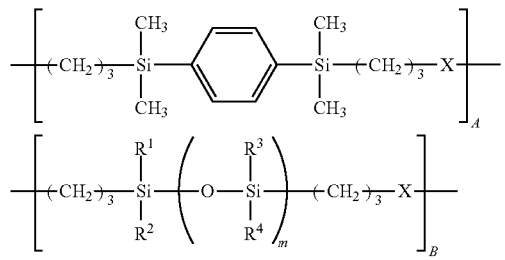

wherein $R^1$ to $R^4$ may be the same or different, and each represents a monovalent hydrocarbon group having 1 to 8 carbon atoms; "m" is an integer of 1 to 100; B is a positive number; A is 0 or a positive number; A+B=1; and X is a divalent organic group represented by the following general formula (2), (2)

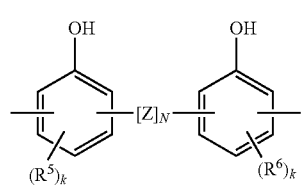

wherein Z represents a divalent organic group selected from any of

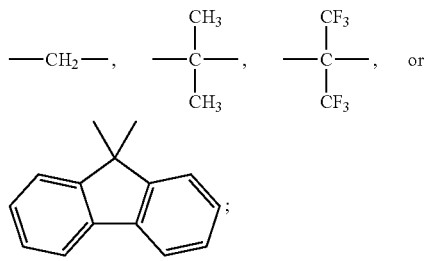

N represents 0 or 1; $R^5$ and $R^6$ each represent an alkyl or alkoxy group having 1 to 4 carbon atoms, and may be the same or different from each other; and "k" represents any of 0, 1, and 2.

6. The temporary adhesive material for a wafer processing according to claim 1, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule, (3)

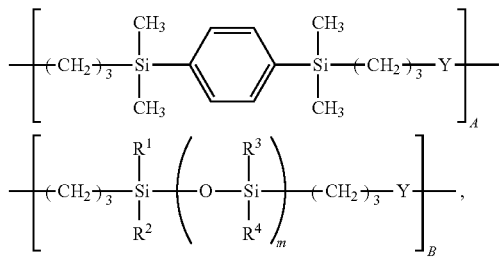

wherein $R^1$ to $R^4$ may be the same or different, and each represents a monovalent hydrocarbon group having 1 to 8 carbon atoms; "m" is an integer of 1 to 100; B is a positive number; A is 0 or a positive number; A+B=1; and Y is a divalent organic group represented by the following general formula (4), (4)

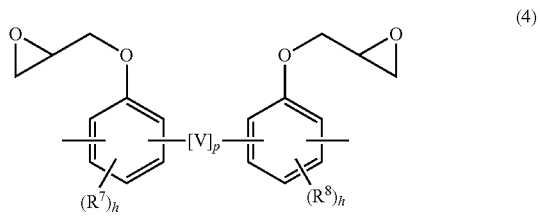

wherein V represents a divalent organic group selected from any of

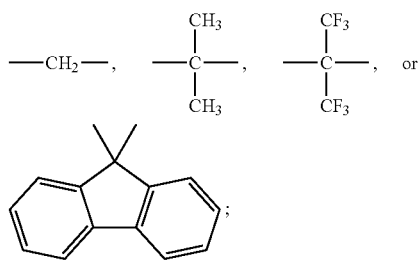

"p" represents 0 or 1; $R^7$ and $R^8$ each represent an alkyl or alkoxy group having 1 to 4 carbon atoms, and may be the same or different from each other; and "h" represents any of 0, 1, and 2.

7. The temporary adhesive material for a wafer processing according to claim 1, wherein the organohydrogenpolysiloxane (A-3) has 3 to 50 silicon-bonded hydrogen atoms (SiH group) per molecule, and has a linear, branched, or cyclic structure.

8. A wafer processing laminate comprising a support, a temporary adhesive material layer formed on the support, and a wafer laminated on the temporary adhesive material layer, the wafer having a circuit-forming front surface and a back surface to be processed, the temporary adhesive material layer including a complex temporary adhesive material layer that has a first temporary adhesive layer composed of a thermosetting siloxane polymer layer (A), a second temporary adhesive layer composed of a thermosetting polymer layer (B) laminated on one surface of the first temporary adhesive layer, and a third temporary adhesive layer composed of a thermoplastic resin layer (C) laminated on the other surface of the first temporary adhesive layer, wherein
the thermosetting siloxane polymer layer (A) is a cured layer of a composition containing:
(A-1) 100 to 50 parts by mass of an organopolysiloxane having an alkenyl group in its molecule;
(A-2) 0 to 50 parts by mass of an organopolysiloxane having $R^{10}{}_3SiO_{0.5}$ units and $SiO_2$ units with a molar ratio of $R^{10}{}_3SiO_{0.5}$ unit/$SiO_2$ unit in the range of from 0.5 to 1.7, where $R^{10}$ represents a substituted or unsubstituted monovalent hydrocarbon group having 1 to 10 carbon atoms, provided that a total of the components (A-1) and (A-2) is 100 parts by mass and the component (A-2) is contained in amount of more than 0 parts by mass;
(A-3) an organohydrogenpolysiloxane having two or more silicon-bonded hydrogen atoms (i.e. Si—H group) per molecule, in such an amount that a molar ratio of the Si—H group in the component (A-3) to the alkenyl group in the component (A-1) in the range of from 0.3 to 15; and
(A-4) an effective amount of a platinum-based catalyst; and
the thermoplastic resin layer (C) is composed of a thermoplastic resin, the thermoplastic resin being one or more selected from the group consisting of
an olefin thermoplastic elastomer,
a polybutadiene thermoplastic elastomer,
a styrene thermoplastic elastomer,
a styrene/butadiene thermoplastic elastomer, and
a styrene/polyolefin thermoplastic elastomer.

9. The wafer processing laminate according to claim 8, wherein the thermosetting siloxane polymer layer (A) further contains (A-5) a reaction retarder in an amount of 0.1 to 10 parts by mass based on 100 parts by mass of a total of the components (A-1), (A-2), and (A-3).

10. The wafer processing laminate according to claim 9, wherein after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm.

11. The wafer processing laminate according to claim 8, wherein after the thermosetting siloxane polymer layer (A) is thermally cured, a 180° peeling force measured at 25° C. by using a test piece having a width of 25 mm is 2 gf or more and 50 gf or less, and a 180° peeling force measured at 180° C. by using a test piece having a width of 25 mm is 40% or more of the 180° peeling force measured at 25° C. by using the test piece having a width of 25 mm.

12. The wafer processing laminate according to claim 8, wherein the thermosetting polymer layer (B) is a cured layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of
an amino condensate modified with formalin or formalin-alcohol,
a melamine resin modified with formalin or formalin-alcohol,
a urea resin modified with formalin or formalin-alcohol,
a phenol compound having on average two or more methylol or alkoxymethylol groups per molecule, and
an epoxy compound having on average two or more epoxy groups per molecule,

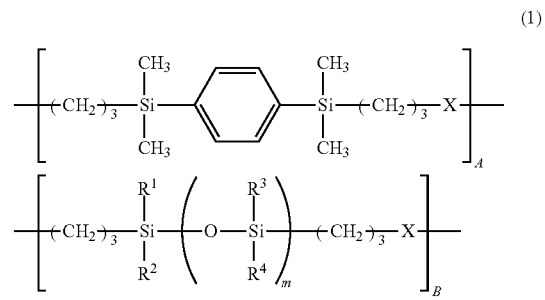

(1)

wherein $R^1$ to $R^4$ may be the same or different, and each represents a monovalent hydrocarbon group having 1 to 8 carbon atoms; "m" is an integer of 1 to 100; B is a positive number; A is 0 or a positive number; A+B=1; and X is a divalent organic group represented by the following general formula (2),

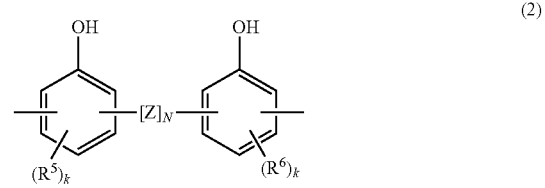

(2)

wherein Z represents a divalent organic group selected from any of

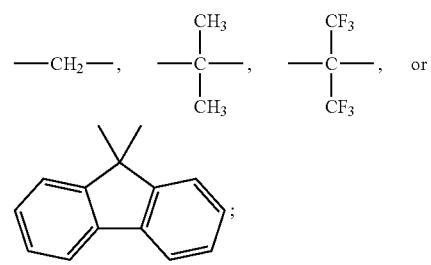

N represents 0 or 1; $R^5$ and $R^6$ each represent an alkyl or alkoxy group having 1 to 4 carbon atoms, and may be the same or different from each other; and "k" represents any of 0, 1, and 2.

13. The wafer processing laminate according to claim 8, wherein the thermosetting polymer layer (B) is a cured layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

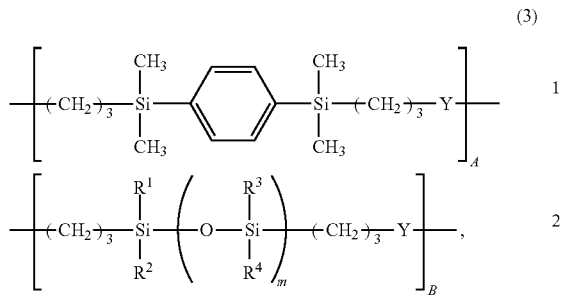

(3)

wherein $R^1$ to $R^4$ may be the same or different, and each represents a monovalent hydrocarbon group having 1 to 8 carbon atoms; "m" is an integer of 1 to 100; B is a positive number; A is 0 or a positive number; A+B=1; and Y is a divalent organic group represented by the following general formula (4),

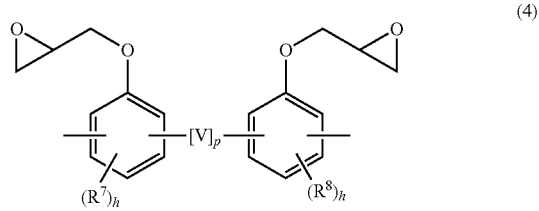

(4)

wherein V represents a divalent organic group selected from any of

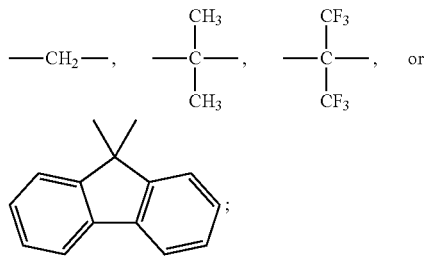

"p" represents 0 or 1; $R^7$ and $R^8$ each represent an alkyl or alkoxy group having 1 to 4 carbon atoms, and may be the same or different from each other; and "h" represents any of 0, 1, and 2.

14. The wafer processing laminate according to claim 8, wherein the organohydrogenpolysiloxane (A-3) has 3 to 50 silicon-bonded hydrogen atoms (SiH group) per molecule, and has a linear, branched, or cyclic structure.

15. A method for manufacturing a thin wafer, comprising the steps of:
   (a) bonding a support to a circuit-forming front surface of a wafer that has the circuit-forming front surface and a non-circuit-forming back surface through the temporary adhesive material for a wafer processing according to claim 1;
   (b) thermally curing the polymer layers;
   (c) grinding or polishing the non-circuit-forming back surface of the wafer bonded to the support;
   (d) processing the non-circuit-forming back surface of the wafer; and
   (e) delaminating the processed wafer from the support.

* * * * *